United States Patent
Llewellyn

(10) Patent No.: US 7,026,866 B2
(45) Date of Patent: Apr. 11, 2006

(54) DC OFFSET SELF-CALIBRATION SYSTEM FOR A SWITCHING AMPLIFIER

(75) Inventor: William D. Llewellyn, San Jose, CA (US)

(73) Assignee: Tripath Technology, Inc., San Jose, CA (US)

( * ) Notice: Subject to any disclaimer, the term of this patent is extended or adjusted under 35 U.S.C. 154(b) by 93 days.

(21) Appl. No.: 10/807,903

(22) Filed: Mar. 23, 2004

(65) Prior Publication Data

US 2004/0227567 A1    Nov. 18, 2004

Related U.S. Application Data

(60) Provisional application No. 60/458,471, filed on Mar. 28, 2003.

(51) Int. Cl.
*H03F 1/02* (2006.01)

(52) U.S. Cl. .................. 330/9; 330/2; 330/10

(58) Field of Classification Search .......... 330/2, 330/9, 10; 327/307
See application file for complete search history.

(56) References Cited

U.S. PATENT DOCUMENTS

| | | | |
|---|---|---|---|
| 4,495,470 A | 1/1985 | Bristol | 330/9 |
| 5,262,957 A | 11/1993 | Hearn | 702/76 |
| 5,298,898 A | 3/1994 | Brunheim | 341/118 |
| 5,631,603 A | 5/1997 | Stubbe et al. | 330/9 |
| 5,757,219 A | 5/1998 | Weedon et al. | 327/307 |
| 5,789,974 A | 8/1998 | Ferguson et al. | 330/2 |
| 5,867,777 A | 2/1999 | Yamaji et al. | 455/234.1 |
| 5,917,378 A | 6/1999 | Juang et al. | 330/253 |
| 5,990,734 A | 11/1999 | Wright et al. | 330/2 |
| 6,060,262 A | 5/2000 | Beer-Romero et al. | 435/15 |
| 6,140,872 A | 10/2000 | McEldowney | 330/9 |
| 6,141,169 A | 10/2000 | Pietruszynski et al. | 360/67 |
| 6,316,992 B1 | 11/2001 | Miao et al. | 360/67 |
| 6,724,248 B1 * | 4/2004 | Llewellyn | 330/9 |

\* cited by examiner

*Primary Examiner*—Khanh V. Nguyen
(74) *Attorney, Agent, or Firm*—Beyer Weaver & Thomas, LLP

(57) ABSTRACT

Techniques for DC offset cancellation are described. According to one embodiment, an amplifier has at least one output and first and second supply rails. The amplifier includes offset cancellation logic which is operable in a calibration mode to generate a first offset cancellation signal when the at least one output is coupled to a first voltage corresponding to the first supply rail, and a second offset cancellation signal when the at least one output is coupled to a second voltage corresponding to the second supply rail. The offset cancellation logic is further operable to facilitate at least partial cancellation of an offset voltage associated with the at least one output during a normal operation mode using a third offset cancellation signal which substantially corresponds to an average of the first and second offset cancellation signals.

20 Claims, 5 Drawing Sheets

DC OFFSET SELF-CALIBRATION SYSTEM FOR A SWITCHING AMPLIFIER

RELATED APPLICATION DATA

The present application claims priority under 35 U.S.C. 119(e) to U.S. Provisional Patent Application Ser. No. 60/458,471 for DC OFFSET SELF-CALIBRATION SYSTEM FOR A SWITCHING POWER AMPLIFIER filed on Mar. 28, 2003, the entire disclosure of which is incorporated herein by reference for all purposes.

BACKGROUND OF THE INVENTION

The present invention relates to switching amplifiers and, more specifically, to improved techniques for reducing or minimizing DC offset voltages in switching amplifiers.

In virtually any amplification system, a standard design goal is the minimization of DC offset voltage. DC offset voltage is defined as a non-zero DC voltage observed at the amplifier output when zero DC voltage is applied to the input. In an audio amplifier, the DC offset voltage can appear suddenly at the output terminals (and thus at the speakers) at the instant the amplifier is energized or activated, producing an unpleasant thump or pop. This phenomenon is observed in both linear and switching (class-D) amplifiers.

Minimization of DC offset voltage can be achieved by the use of carefully matched circuit elements, by adaptive (i.e., self-adjusting) mechanisms, or both. Some amplification systems are designed with relays between their output stages and the speakers that are open at the time the amplifier is energized and close only after a very slow acting continuous time servo loop has had sufficient time to null the output offset. The use of relays is costly, however, and can impact reliability as well. The slow acting servo loop also requires a time constant that is large (it must be significantly greater than the period of the lowest audio frequency being amplified) and is therefore difficult to integrate onto a silicon chip. Digital implementation of this same form of slow, real-time servo loop requires a large number of bits (e.g., 16 or more) which is also prohibitive.

Another technique employs a sub-block of a switching amplifier processor IC that nulls the output offset using a modest DAC (e.g., one 10-bit DAC per channel) and digital control circuitry. Each DAC's output is summed into its respective channel input along with the incoming signal. Offset cancellation occurs before amplification begins and after a predetermined stabilization period that follows the call for amplification. This stabilization period allows for settling of local time constants, e.g., the charging of the amplifier's input DC blocking capacitor(s). A DC offset cancellation routine then runs between the end of the stabilization period and the onset of actual switching amplification.

During the DC offset cancellation routine, digital control circuitry searches out a DAC value that substantially cancels output-referred offset. After completion of the routine, each channel's DAC will apply a DC signal to its respective channel input that effectively cancels systematic offsets as observed at the amplifier outputs. Once the offset cancellation DAC input value for each channel is determined, it is latched and the amplifier is enabled for normal amplification. The DAC input value for each channel remains constant throughout the duration of amplification until the amplifier is either muted or turned off. The DC offset cancellation routine is executed anew each time the amplifier is energized regardless of the previous offset cancellation results in order to accommodate any thermal drift or other changes that may have affected the amplifier over time.

In the bridged type of amplifier a special concern arises from the non-zero common mode output voltage (Vcm) present during amplification. Most bridged type amplifiers use only one voltage supply for the output power stage (usually positive and referred to herein as Vdd). In fact, the choice of a bridged type output stage is often made specifically so that only a single power supply is needed while maintaining a peak to peak output voltage swing of 2×Vdd. Since the positive and negative amplifier output terminals (V+ and V−, respectively) can each swing only between ground (0V) and Vdd, and assuming they are truly complementary, the common mode voltage (Vcm) is Vdd/2. Any mismatch between the resistors in the differential feedback path will introduce an offset component that is proportional to Vcm. Thus, during the execution of the offset cancellation routine, it is necessary to bias the amplifier outputs such that V+=V−=Vdd/2 (or to mimic these same conditions by other means), just as is the case during normal amplification, in order for the DC offset cancellation block to properly accommodate any offset that might exist in the differential resistive feedback path from the power stage.

Achieving the mid-rail condition of V+=V−=Vdd/2 at conventional 2-state switching outputs is difficult, however. Any scheme that attempts to do this (for example, by placing the output stage(s) in a tri-stated condition and introducing a resistive divider network between Vdd and ground via transmission gates or even relays) adds components, reduces reliability, and may introduce a pop or click into the speakers when engaged or disengaged. A permanent resistor divider network could be used, but it would waste power and would also add unnecessary components to the system.

In one previous technique (described in pending U.S. patent application Ser. No. 10/127,357 for DC OFFSET SELF-CALIBRATION SYSTEM FOR A DIGITAL SWITCHING AMPLIFIER filed Apr. 19, 2002, the entire disclosure of which is incorporated herein by reference), a DC offset cancellation block includes a single 10-bit (9 weighted bits plus sign bit) successive approximation register (SAR) and a 10-bit DAC (or one 10-bit DAC per channel in a multi-channel system) with control/sequencing circuitry. The described technique is quite time-efficient (in practice each channel can take approximately 1.5 ms to calibrate), but it is logic-intensive and therefore silicon area intensive. For example, a 4-channel DC offset cancellation block implemented according to such a technique may contain the equivalent of 1900 gates (one gate being equivalent in size to a single logic inverter). It also does not down-scale well, i.e., if reduced to two channels, the gate count is still approximately 1650.

The successive approximation register (SAR) method mentioned above consumes a significant amount of circuit area with digital circuitry. This is particularly problematic if the IC process on which the circuitry is manufactured is optimized for analog design or even for high voltage circuitry and does not have deep submicron devices available to help in constructing compact digital circuitry.

It is therefore desirable to provide improved techniques for reducing or minimizing DC offset in switching amplifiers.

SUMMARY OF THE INVENTION

According to the present invention, techniques for reducing or minimizing DC offset in switching amplifiers are provided. According to a specific embodiment, an amplifier has at least one output and first and second supply rails. The amplifier includes offset cancellation logic which is operable in a calibration mode to generate a first offset cancellation signal when the at least one output is coupled to a first voltage corresponding to the first supply rail, and a second offset cancellation signal when the at least one output is coupled to a second voltage corresponding to the second supply rail. The offset cancellation logic is further operable to facilitate at least partial cancellation of an offset voltage associated with the at least one output during a normal operation mode using a third offset cancellation signal which substantially corresponds to an average of the first and second offset cancellation signals.

According to another specific embodiment, a switching amplifier includes a power output stage having first and second outputs forming a differential output, and first and second supply rails. A processor stage is operable to receive a single-ended input signal and generate a processed differential signal for amplification by the power output stage. The processor stage further includes offset cancellation logic which is operable in a calibration mode to generate a first offset cancellation signal when the first and second outputs are coupled to a first voltage corresponding to the first supply rail, and a second offset cancellation signal when the first and second outputs are coupled to a second voltage corresponding to the second supply rail. The offset cancellation logic is further operable to facilitate at least partial cancellation of an offset voltage associated with the different output during a normal operation mode using a third offset cancellation signal which substantially corresponds to an average of the first and second offset cancellation signals.

A further understanding of the nature and advantages of the present invention may be realized by reference to the remaining portions of the specification and the drawings.

DETAILED DESCRIPTION OF SPECIFIC EMBODIMENTS

Figure 1:
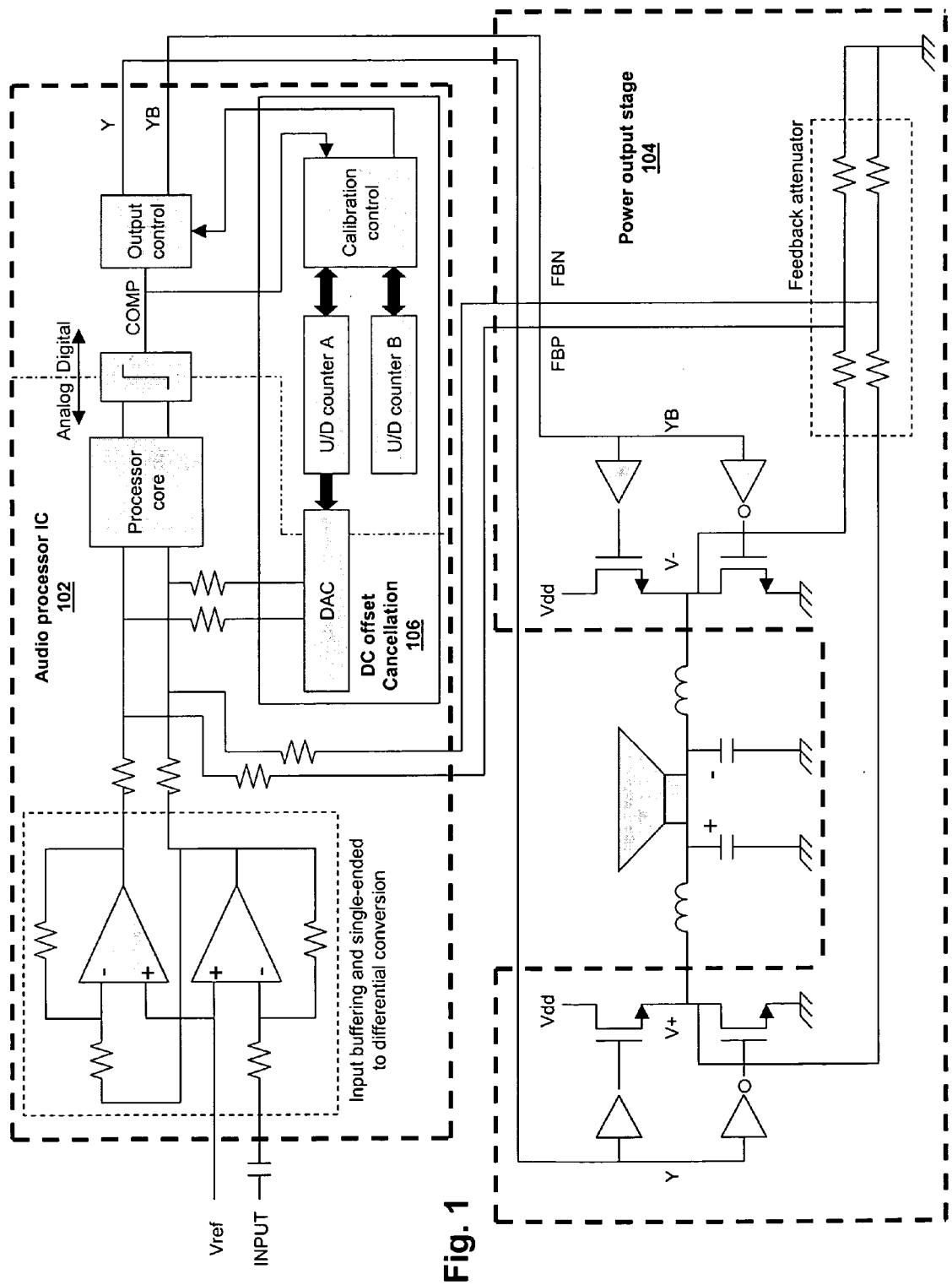
FIG. 1 is a simplified schematic diagram of a differential switching amplifier designed according to a specific embodiment of the invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

According to various specific embodiments of the invention, a DC offset cancellation technique is provided which employs the rail-to-rail switching characteristics of the typical class-D power output stage to emulate the Vdd/2 (half-rail) common mode voltage during the offset cancellation process. According to a specific embodiment, processor circuitry is provide which performs two offset cancellation routines on each channel, the first with both V+ and V− outputs held high (i.e., at Vdd), and the second with both V+ and V− outputs held low (i.e., to ground). The two DAC word values derived during this two-pass operation are averaged and the result is applied to the DAC during amplification. This approach emulates a single DC offset cancellation routine done with the amplifier output at V+=V−=Vdd/2 without the need for complex output biasing.

According to one embodiment, the approach is similar to the previous SAR method described above. However, even though the same DAC is employed (per channel) as in the previous SAR method, this embodiment of the invention uses approximately one-third of the amount of digital circuitry (for 2 channels) as that of the previous SAR method. Specifically, the previous SAR method employed a full SAR bit-by-bit determination engine, banks of latches that held the values of the DC cancellation words, a full adder block, and a latch/multiplexer block that had the capability of right shifting by one bit (dividing by 2). In contrast, a specific embodiment of the present invention uses one dedicated ripple-type up/down counter per channel (i.e., no latches or multiplexers), a single, secondary up/down counter, all-zeroes and all-ones state decoder logic, and a state machine to control the overall DC cancellation sequence. If additional channels are incorporated, each new channel needs only a DAC and its associated up/down counter with a minor amount of additional control logic. Thus, a considerable advantage in chip area may be realized with the present invention as compared to the previous SAR method.

Figure 2:
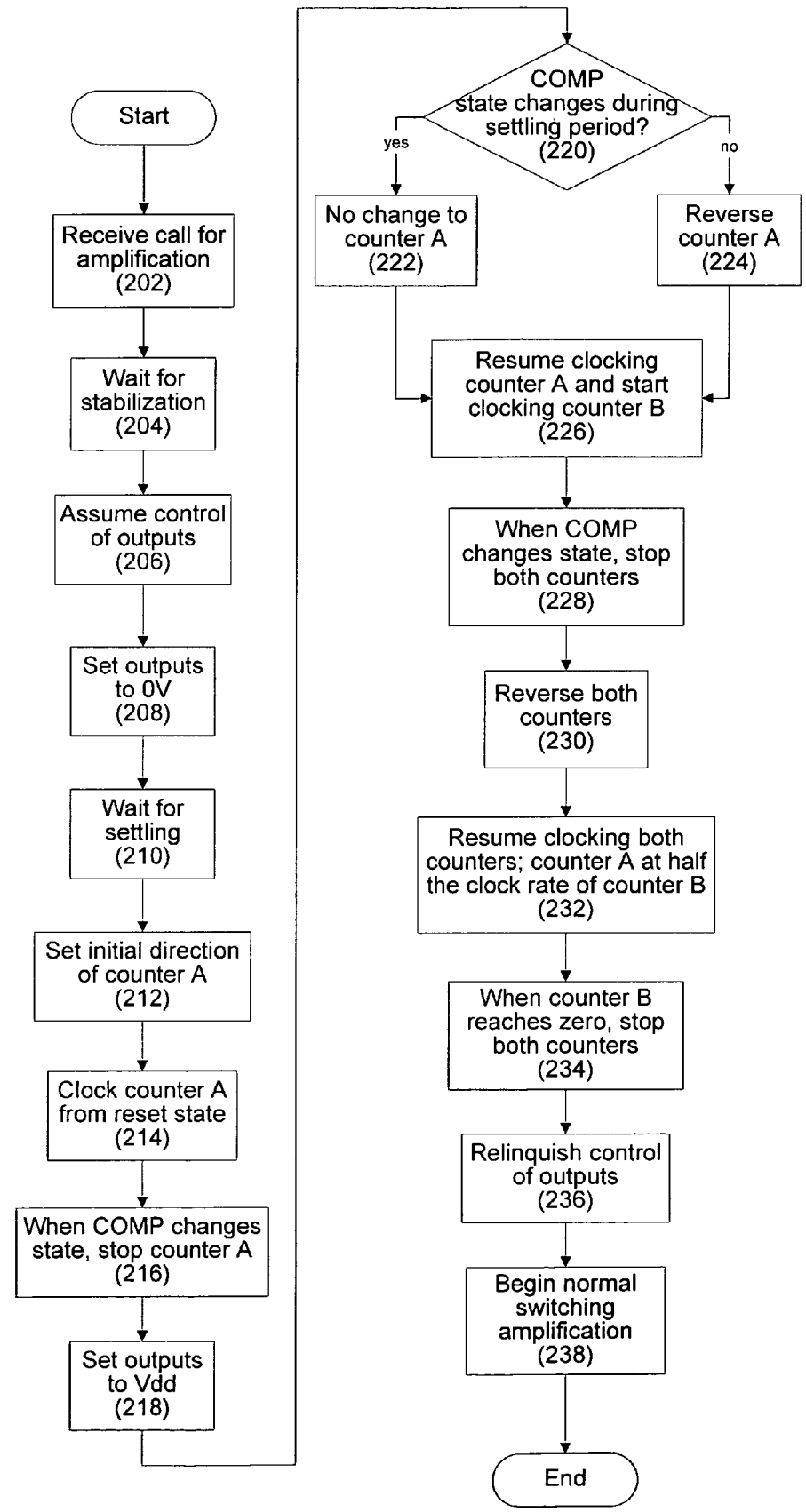
FIG. 2 is a process flow illustrating a DC offset cancellation routine according to a specific embodiment of the invention.

FIG. 1 is a schematic diagram for illustrating DC offset cancellation in a single channel of an amplifier system according to a specific embodiment of the invention. For exemplary purposes, the implementation shown in FIG. 1 is assumed to be part of a multiple-channel audio amplification system. However, it will be understood that any number of channels may be employed for amplification within any of a wide range of frequency bands and remain within the scope of the invention. In a particular exemplary embodiment, Vref is 2.5V, processor IC 102 is a 5V CMOS chip with 0.5 um minimum MOS gate length, and Vdd for power output stage 104 is 14V (e.g., a typical automobile battery voltage). FIG. 2 is a process flow diagram illustrating a DC offset cancellation process which may be implemented in the system of FIG. 1.

When amplification is called for (202), i.e., the amplifier is energized or unmuting begins, actual amplification is temporarily held off. After a stabilization delay (204), DC offset cancellation logic 106 takes over control of the Y and YB outputs of processor 106 (and therefore the V+ and V− amplifier outputs) for the duration of the DC offset cancellation sequence (206). The outputs V+ and V− are then set to 0V (208).

After a brief settling period (210), the state of COMP is latched in the state machine to set the initial direction of counter A, i.e., if COMP=1, counter A counts down; if COMP=0, counter A counts up (212). Counter A is then clocked from its reset state, e.g., mid value, 1000000000 (214). When COMP changes state, counter A clocking is stopped (216) and V+ and V− are set to Vdd (218).

If COMP state changes back during an allowed settling period (220), the direction of counter A is left unchanged (222). If, however, COMP remains unchanged during the allowed settling period (220), the direction of the counter A is reversed (224).

Counter A clocking starts again, and counter B is clocked (up from zero) simultaneously with counter A (226). When COMP changes state, both counters A and B are stopped (228). The directions of both counters A and B are then reversed (230), and both counters A and B are again clocked, but counter A is clocked at half the clock rate (frequency) of counter B (232). When counter B reaches zero, both counters A and B are stopped (234), and DC calibration for the channel is complete. The Y and YB outputs of the processor once again are set to respond to the COMP signal, closing the normal loop (236). Normal switching amplification then begins (238).

According to a particular implementation, if counter A saturates (i.e., all zeroes or all ones) during the offset cancellation process, the entire DC calibration engine is reset to its starting point (which sets the counter A to its mid point of 1000000000) and is stopped. This assumes a problem arose (e.g., the offset is too large to correct, or a noise spike caused a gross error during the operation) and the calibration is abandoned in a fail safe state (i.e., do no harm).

Figure 3:
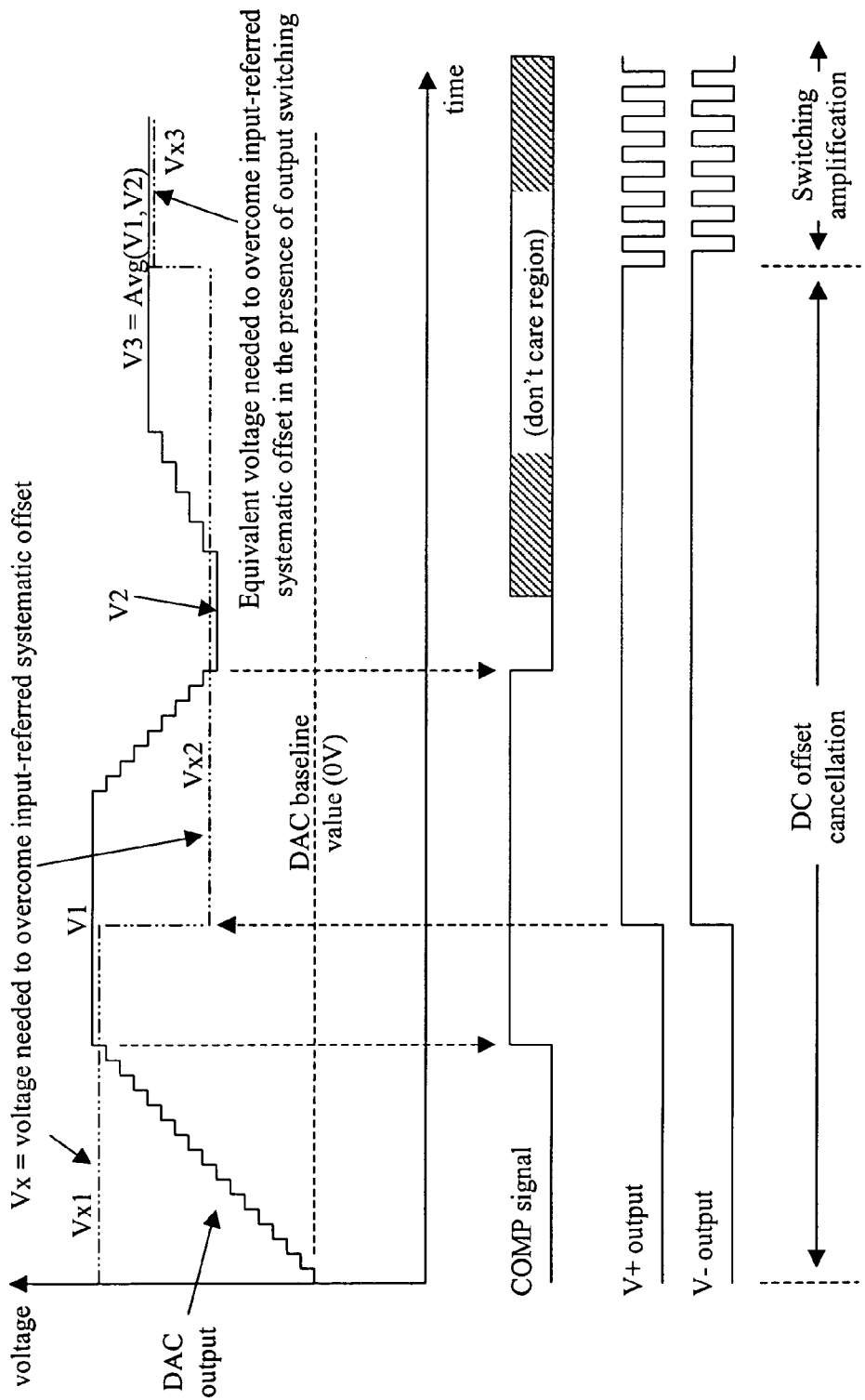
FIG. 3 is an exemplary timing diagram illustrating the operation of a specific embodiment of the DC offset cancellation routine of the invention.

FIG. 3 is a timing diagram illustrating the operation of an exemplary DC offset cancellation circuit designed according to one embodiment of the invention. The voltage axis shows the DAC output (solid line) and the equivalent channel input voltage Vx (dot-dot-dash line) needed to overcome the input-referred DC offset. In this example, the system starts with a negative offset while the V+ and V− outputs are held at 0V, indicated by an initial logic "0" at the COMP signal. This offset requires a positive DAC ramp, so the control circuitry sets counter A to count up and begins ramping the DAC in the positive direction, one LSB per step per clock cycle.

Eventually the DAC voltage is large enough to reach Vx1 and overcome the offset, and the COMP signal goes to a logic "1." The V+ and V− outputs are then set to Vdd, and Vx steps in the negative direction to Vx2 due to a mismatch in the feedback resistors. Because COMP did not change state after V+ and V− switched to Vdd, counter A reverses direction and the DAC is ramped downward until COMP finally does change state. While counter A is making this second ramp, counter B (not shown) counts up from zero by an identical number of clock cycles. After this second ramp terminates, COMP is ignored and both counter A and counter B directions are reversed.

Clocking of both counters begins again, with counter B running at the normal clock rate and counter A at half the clock rate (as can be seen by the longer steps in the ramp). Once counter B reaches zero, both counters are stopped. At this point, counter A has stopped half way between V1 and V2 at a voltage V3 that corresponds to an average of the previous two values. Switching amplification then begins, and because the output switching pattern by definition has a 50% duty cycle in the long term, Vx assumes an average value Vx3 halfway between Vx1 and Vx2, essentially coinciding with voltage V3 being issued from the DAC. This cancels the input-referred system offset to within one DAC LSB or less.

Figure 4:
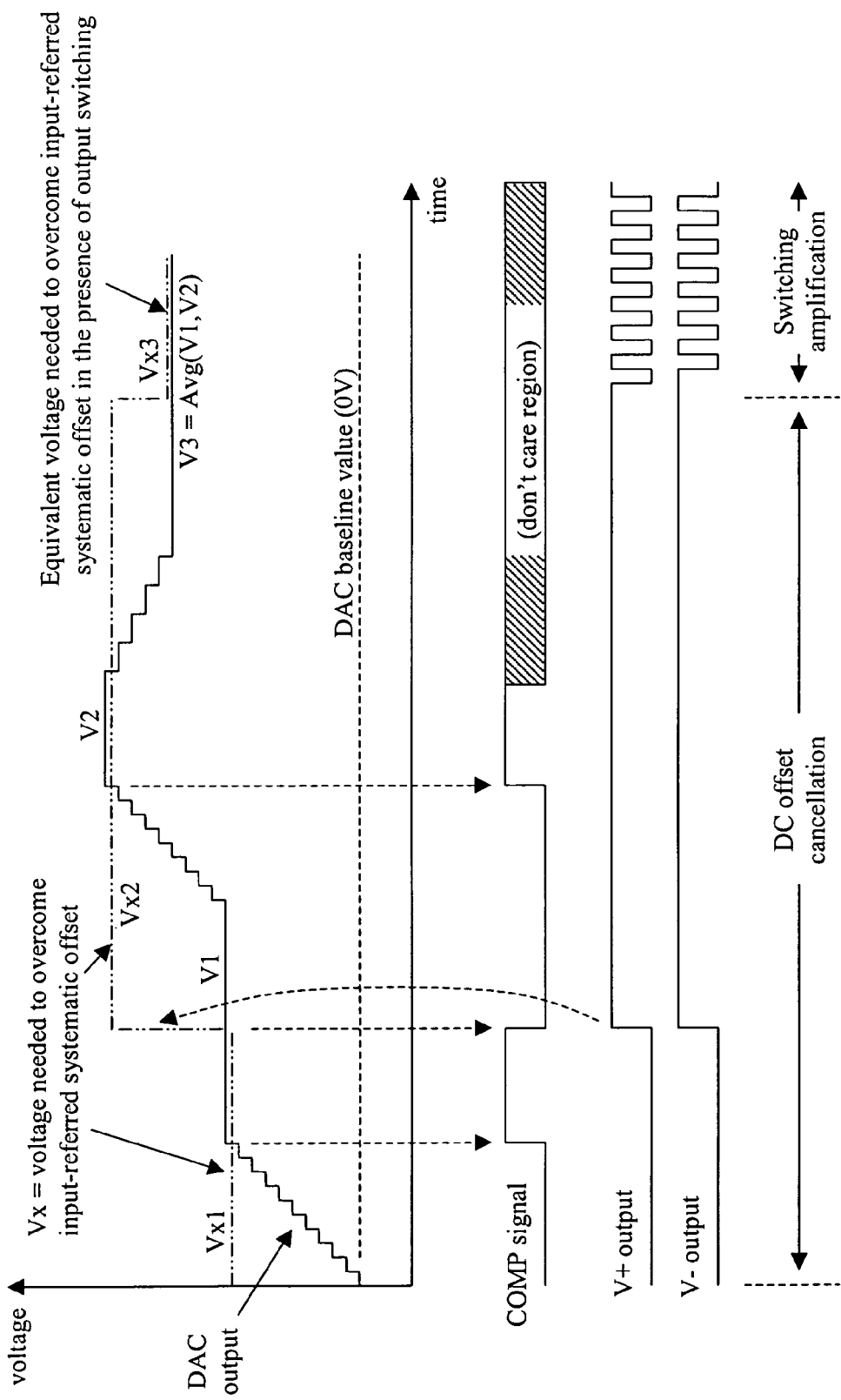
FIG. 4 is another exemplary timing diagram illustrating the operation of a specific embodiment of the DC offset cancellation routine of the invention.

FIG. 4 shows another example sequence of a DC offset cancellation circuit designed according to the invention in operation. The voltage axis shows the DAC output (solid line) and the equivalent channel input voltage Vx (dot-dot-dash line) needed to overcome the input-referred DC offset. In this example, the system also starts with a negative offset while the V+ and V− outputs are held at 0V, indicated by an initial logic "0" at the COMP signal. This offset requires a positive DAC ramp, so the control circuitry sets counter A to count up and begins ramping the DAC in the positive direction, one LSB per step per clock cycle.

Eventually the DAC voltage is large enough to reach Vx1 and overcome the offset, and the COMP signal goes to a logic "1." The V+ and V− outputs are then set to Vdd, and Vx steps in the positive direction to Vx2 due to a mismatch in the feedback resistors. In this case, COMP changed state after V+ and V− switched to Vdd, and counter A therefore does not reverse direction. The DAC is then ramped upward until COMP changes state again. As before, while counter A is making this second ramp, counter B (not shown) counts up from zero by an identical number of clock cycles. After this second ramp terminates, COMP is ignored and both counter A and counter B directions are reversed.

Clocking of both counters begins again, with counter B running at the normal clock rate and counter A at half the clock rate (as can be seen by the longer steps in the ramp). Once counter B reaches zero, both counters are stopped. At this point, counter A has stopped half way between V1 and V2 at a voltage V3 that corresponds to an average of the previous two values. Switching amplification then begins, and because the output switching pattern by definition has a 50% duty cycle in the long term, Vx assumes an average value Vx3 halfway between Vx1 and Vx2, essentially coinciding with voltage V3 being issued from the DAC. This cancels the input-referred system offset to within one DAC LSB or less.

Figure 5:
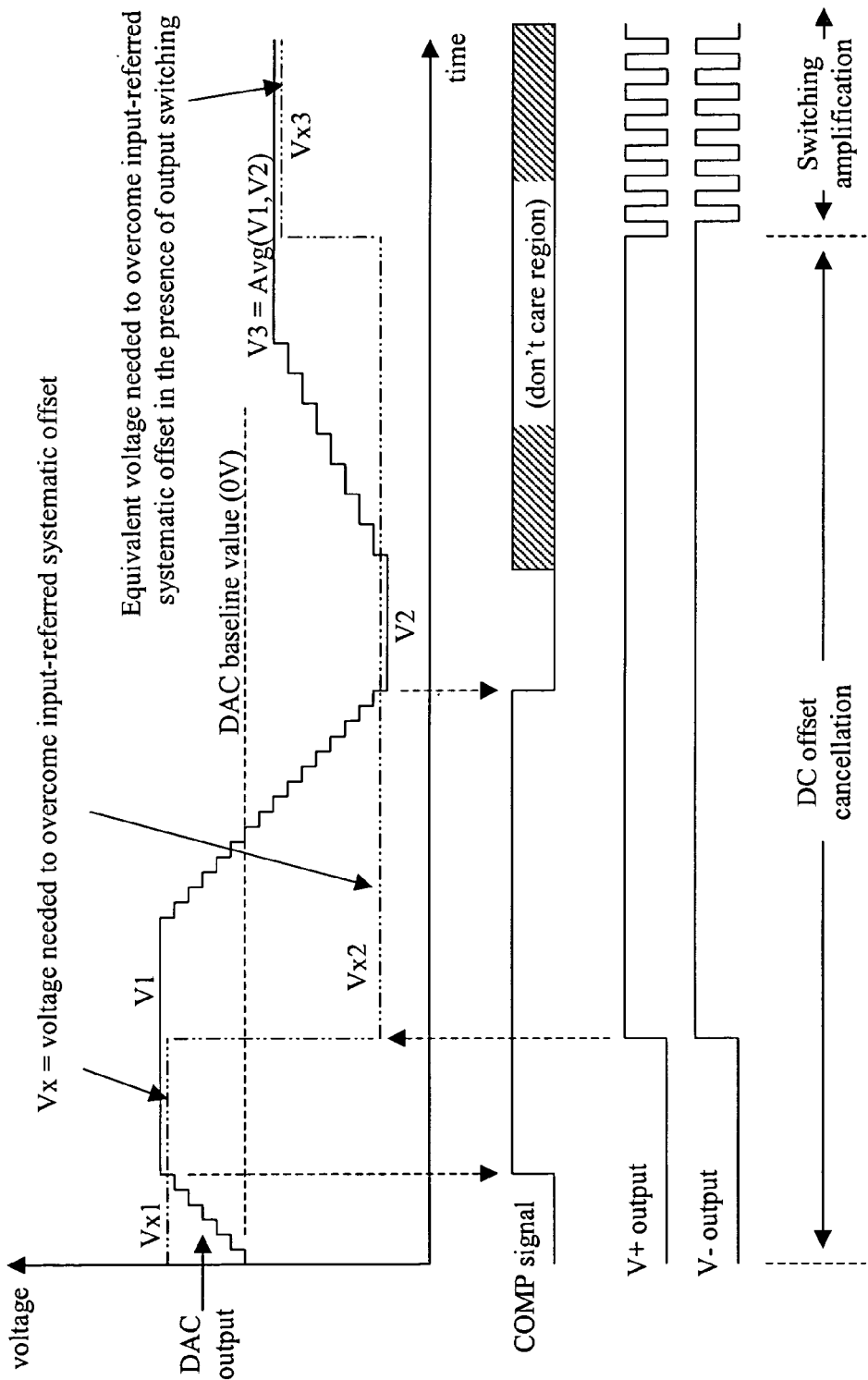
FIG. 5 is yet another exemplary timing diagram illustrating the operation of a specific embodiment of the DC offset cancellation routine of the invention.

FIG. 5 shows yet another example sequence of a DC offset cancellation circuit designed according to the invention in operation. The voltage axis shows the DAC output (solid line) and the equivalent channel input voltage Vx (dot-dot-dash line) needed to overcome the input-referred DC offset. In this example, the system again starts with a negative offset while the V+ and V− outputs are held at 0V, indicated by an initial logic "0" at the COMP signal. This offset requires a positive DAC ramp, so the control circuitry sets counter A to count up and begins ramping the DAC in the positive direction, one LSB per step per clock cycle.

Eventually the DAC voltage is large enough to reach Vx1 and overcome the offset, and the COMP signal goes to a logic "1." The V+ and V− outputs are then set to Vdd, and Vx steps in the negative direction to Vx2 due to a mismatch in the feedback resistors. In this case, COMP did not change state after V+ and V− switched to Vdd, so counter A reverses direction. The DAC is then ramped downward until COMP changes state again. In this instance the value for Vx2 is negative and the second ramp is actually longer than the first (which is not of consequence in the operation of the circuit). As before, while counter A is making this second ramp, counter B (not shown) counts up from zero by an identical number of clock cycles. After this second ramp terminates, COMP is ignored and both counter A and counter B directions are reversed.

Clocking of both counters begins again, with counter B running at the normal clock rate and counter A at half the clock rate (as can be seen by the longer steps in the ramp). Once counter B reaches zero, both counters are stopped. At this point, counter A has stopped half way between V1 and V2 at a voltage V3 that corresponds to an average of the previous two values. Switching amplification then begins, and because the output switching pattern by definition has a 50% duty cycle in the long term, Vx assumes an average value Vx3 halfway between Vx1 and Vx2, essentially coinciding with voltage V3 being issued from the DAC. This cancels the input-referred system offset to within one DAC LSB or less.

In the above DC offset cancellation sequences, it is perfectly acceptable for there to be an odd number of LSB steps between V1 and V2 (in fact, this could occur 50% of the time). Since the averaging technique can only work with whole LSB steps, it cannot divide an odd number in half and instead stops at a value ½ LSB away from the true average of V1 and V2. A rule-of-thumb target for minimization of output referred DC offset for acceptable "turn on pop" in an audio amplifier is 10 mV or less, and since each LSB step corresponds to perhaps 1 mV to 2 mV at the amplifier output in a typical design an error of ½ LSB is not of concern.

It is worth mentioning that the nature of this DC offset cancellation technique actually allows counter A (and therefore the DAC output) to start from any value and the system will converge on a result, as long as it is within the DAC's range. In the described embodiment, counter A, whose individual bit outputs are connected directly to the offset cancellation DAC, is not started from a conventional all-zeroes state, but instead from its mid value (1000000000), which places the differential (and bi-directional) DAC at its neutral position (positive and negative output voltages are equal). Since it is reasonable to expect that in volume manufacturing the amplifier system described herein will have a statistical DC offset distribution centered on or near 0V, placing the DAC at its 0V value at the beginning of the offset cancellation routine should, on average, minimize the number of clock cycles counter A has to count to accommodate DC offset, thereby producing the statistically fastest result.

It should be appreciated that the various embodiments of the invention may be implemented in a wide variety of ways without departing from the scope of the invention. That is, the processes and circuits described herein may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., FPGAs) suitable for designing and manufacturing the processes and circuits described herein are within the scope of the invention.

Moreover, the functional blocks in the embodiments of the invention may take various forms. For example, they may include one or more general-purpose microprocessors that are selectively configured or reconfigured to implement the functions described herein. Alternatively, they may include one or more specially designed processors or microcontrollers that contain logic and/or circuitry for implementing the functions described herein. Any of the devices serving as one of the functional blocks may be designed as general purpose microprocessors, microcontrollers (sometimes simply referred to as "controllers"), ASICs (application specific integrated circuits), DSPs (digital signal processors), PLDs (programmable logic devices), FPGAs (field programmable gate arrays), and the like. They may execute instructions under the control of the hardware, firmware, software, reconfigurable hardware, combinations of these, etc.

While the invention has been particularly shown and described with reference to specific embodiments thereof, it will be understood by those skilled in the art that changes in the form and details of the disclosed embodiments may be made without departing from the spirit or scope of the invention. For example, although embodiments have been described herein with reference to bridged (i.e., differential) amplifier topologies, the output DC offset cancellation of the present invention may also be employed in amplifiers that have single-ended outputs.

Moreover, even though the foregoing description refers to a switching amplifier topology, it will be understood that the principles of the present invention may be applied to both linear and switching amplifier architectures. One example of a switching amplifier topology in which the present invention may be practiced is the "Class T" amplifier provided by Tripath Technology, Inc., of San Jose, Calif. A basic description of such an amplifier topology is provided in U.S. Pat. No. 5,777,512 for METHOD AND APPARATUS FOR OVERSAMPLED, NOISE-SHAPING, MIXED-SIGNAL PROCESSING issued on Jul. 7, 1998, the entire disclosure of which is incorporated herein by reference for all purposes. It will be understood, however, that the present invention is not limited to this or any particular amplifier topology.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. An amplifier comprising at least one output and first and second supply rails, the amplifier further comprising offset cancellation logic which is operable in a calibration mode to generate a first offset cancellation signal when the at least one output is coupled to a first voltage corresponding to the first supply rail, and a second offset cancellation signal when the at least one output is coupled to a second voltage corresponding to the second supply rail, the offset cancellation logic further being operable to facilitate at least partial cancellation of an offset voltage associated with the at least one output during a normal operation mode using a third offset cancellation signal which substantially corresponds to an average of the first and second offset cancellation signals, wherein the offset cancellation logic comprises a digital-to-analog converter (DAC), a first up/down counter, a second up/down counter, and calibration control logic, the calibration control logic being operable to configure the amplifier for the calibration and normal operation modes, the calibration control logic further being operable during the calibration mode to control the first and second counters and the DAC via one of the counters to generate the first and second offset cancellation signals, the DAC being operable during normal operation mode to generate the third offset cancellation signal.

2. The amplifier of claim 1 wherein the amplifier comprise one of a switching amplifier topology and a linear amplifier topology.

3. The amplifier of claim 1 wherein the switching amplifier topology employs continuous-time feedback from the at least one output.

4. The amplifier of claim 1 wherein the amplifier comprises one of a single-ended amplifier and a differential amplifier.

5. The amplifier of claim 1 wherein the amplifier comprises multiple channels, each of the channels comprising an instance of the offset cancellation logic.

6. The amplifier of claim 1 wherein the offset cancellation logic is operable to generate the third offset cancellation signal during the calibration mode.

7. The amplifier of claim 1 wherein the amplifier comprises a switching differential amplifier, and the at least one output comprises first and second outputs which together form a differential output.

8. The amplifier of claim 7 wherein the offset cancellation logic is operable to generate the first offset cancellation signal when the first and second outputs are coupled to the first voltage, and the second offset cancellation signal when the first and second outputs are coupled to the second voltage.

9. The amplifier of claim 1 wherein the amplifier is optimized for operation in a frequency range.

10. The amplifier of claim 9 wherein the frequency range comprises the audio frequency range.

11. The amplifier of claim 1 further comprising a processor stage and a power output stage, the offset cancellation logic being part of the processor stage.

12. At least one computer-readable medium having data structures stored therein representative of the processor stage of claim 11.

13. The at least one computer-readable medium of claim 12 wherein the data structures comprise a simulatable representation of the processor stage.

14. The at least one computer-readable medium of claim 13 wherein the simulatable representation comprises a netlist.

15. The at least one computer-readable medium of claim 12 wherein the data structures comprise a code description of the processor stage.

16. The at least one computer-readable medium of claim 15 wherein the code description corresponds to a hardware description language.

17. A set of semiconductor processing masks representative of at least a portion of the processor stage of claim 11.

18. An integrated circuit comprising the offset cancellation logic of claim 1.

19. An electronic system comprising the integrated circuit of claim 18.

20. A switching amplifier comprising
a power output stage comprising first and second outputs forming a differential output, and first and second supply rails; and
a processor stage operable to receive an input signal and generate a processed differential signal for amplification byte power output stage, the processor stage further comprising offset cancellation logic which is operable in a calibration mode to generate a first offset cancellation signal when the first and second outputs are coupled to a first voltage corresponding to the first supply rail, and a second offset cancellation signal when the first and second outputs are coupled to a second voltage corresponding to the second supply rail, the offset cancellation logic further being operable to facilitate at least partial cancellation of an offset voltage associated with the different output during a normal operation mode using a third offset cancellation signal which substantially corresponds to an average of the first and second offset cancellation signals, wherein the offset cancellation logic comprises a digital-to-analog converter (DAC), a first up/down counter, a second up/down counter, and calibration control logic, the calibration control logic being operable to configure the amplifier for the calibration and normal operation modes, the calibration control logic further being operable during the calibration mode to control the first and second counters and the DAC via one of the counters to generate the first and second offset cancellation signals, the DAC being operable during normal operation mode to generate the third offset cancellation signal.

* * * * *

UNITED STATES PATENT AND TRADEMARK OFFICE
CERTIFICATE OF CORRECTION

| | | |
|---|---|---|
| PATENT NO. | : 7,026,866 B2 | Page 1 of 1 |
| APPLICATION NO. | : 10/807903 | |
| DATED | : April 11, 2006 | |
| INVENTOR(S) | : William D. Llewellyn | |

It is certified that error appears in the above-identified patent and that said Letters Patent is hereby corrected as shown below:

In the Claims:

In line 7 of claim 20 (column 10, line 15) change "byte" to --by the--.

Signed and Sealed this

Fifth Day of December, 2006

JON W. DUDAS
*Director of the United States Patent and Trademark Office*